(12) United States Patent
Marschner et al.

(10) Patent No.: US 10,708,114 B2
(45) Date of Patent: Jul. 7, 2020

(54) QUADRATURE RADIO RECEIVER WITH GAIN-DEPENDENT MISMATCH CORRECTION

(71) Applicant: NXP B.V., Eindhoven (NL)

(72) Inventors: Juergen Richard Marschner, Hamburg (DE); Robert Rutten, Nistelrode (NL); Niels Gabriel, Buchholz (DE); Tjeu van Ansem, Gemert-Bakel (NL); Francoise Jeannette Harmsze, Heeze (NL); Peter Blinzer, Hamburg (DE); Frits Anthonie Steenhof, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/122,132

(22) Filed: Sep. 5, 2018

(65) Prior Publication Data

US 2020/0076671 A1 Mar. 5, 2020

(51) Int. Cl.
*H03H 7/54* (2006.01)
*H04L 27/38* (2006.01)
*H03D 3/00* (2006.01)
*H04L 27/36* (2006.01)

(52) U.S. Cl.
CPC ......... *H04L 27/3863* (2013.01); *H03D 3/009* (2013.01); *H03H 7/54* (2013.01); *H04L 27/364* (2013.01)

(58) Field of Classification Search
CPC .. H04B 17/21; H04B 17/309; H04B 17/0085; H04B 17/20; H04B 1/408; H04B 1/0475; H04L 27/34
See application file for complete search history.

(56) References Cited

U.S. PATENT DOCUMENTS

| | | | |
|---|---|---|---|
| 6,009,317 A | 12/1999 | Wynn | |
| 7,496,340 B1 | 2/2009 | Chen et al. | |
| 10,447,523 B2 | 10/2019 | Wenzel et al. | |
| 2003/0231723 A1 | 12/2003 | Hansen | |
| 2007/0058755 A1 | 3/2007 | Husted | |
| 2007/0080835 A1 | 4/2007 | Maeda et al. | |
| 2010/0330947 A1 | 12/2010 | Khoury et al. | |
| 2011/0026570 A1* | 2/2011 | Feng | H04B 17/21 375/224 |

OTHER PUBLICATIONS

M. Windisch and G. Fettweis, "Blilnd I/Q Imbalance Parameter Estimation and Compensation in Low-IF Receivers," IEEE 2004.

* cited by examiner

*Primary Examiner* — Rahel Guarino (74) *Attorney, Agent, or Firm* — Rajeev Madnawat (57) ABSTRACT

Certain aspects of the disclosure are directed to in-phase/quadrature (IQ) mismatch detection and correction in radio frequency receivers. According to a specific example, a method of manufacture or use comprises, in a quadrature radio-frequency receiver configured to process signals using I and Q components, providing parameters indicative of IQ mismatches associated with circuitry of the quadrature radio-frequency receiver due to changes in signal gain. The method further includes, while using the quadrature radio-frequency receiver to receive and process a received radio signal, correcting for the IQ mismatches by using the parameters in response to actual signal gain change.

18 Claims, 4 Drawing Sheets

QUADRATURE RADIO RECEIVER WITH GAIN-DEPENDENT MISMATCH CORRECTION

OVERVIEW

Aspects of various embodiments are directed to in-phase/quadrature (IQ) mismatch detection and correction in radio frequency receivers, and in particular, although not exclusively, involving circuits and methods of use/manufacture involving mismatch correction for a radio frequency receiver.

Modern radio frequency receivers, such as those used for wideband data reception, typically comprise both analogue and digital sections in order to efficiently process signals. A difficulty found in conventional radio frequency receivers relates to providing the required image rejection properties in an efficient manner.

More specifically, many broadcast receivers used in portable or mobile applications have high dynamic range requirements for which the gain of the signal path needs to be adapted frequently to optimize the signal-to-noise ratio and avoid overload. In connection with reasons including containment of system cost, these receivers are designed with high-levels of integration and often involve low- or zero-intermediate frequency (IF) receiver architectures with in-phase (I) and quadrature-phase (Q) signal processing paths and high-image rejection requirements. Among other types of receivers, such IQ/quadrature architectures experience signal gain changes that can lead to changes in the IQ mismatch and such gain changes can occur often (e.g., every 50 microseconds or less).

While some IQ gain correction systems have been implemented to address these issues by using separate analogue and digital sections to process the received signals effectively, they have required long integration times (e.g., greater than 10 milliseconds) to detect, track and correct for the error with sufficient low noise. For example, many such radio frequency receivers used for wideband data reception provide a degree of correction which is considered somewhat effective, but they experience a difficulty in attempting to provide the required image rejection properties in an efficient manner. The image rejection parameter, often expressed as a ratio of wanted-to-unwanted signal in terms of dB, can be significantly reduced in dynamic-reception situations involving common signal-reception issues such as fading and/or multipath. This can lead to interference between the wanted and the image signal so that the transmitted information cannot be recovered.

These and other matters have presented challenges to quadrature-based radio frequency receivers and for a variety of related circuits and applications.

Accordingly, aspects of the present disclosure are directed to issues such as those addressed above and/or to other issues which may become apparent.

SUMMARY

Various example embodiments are directed to issues such as those addressed above and/or others, concerning accounting for known in-phase/quadrature (IQ) mismatches associated with radio-signal receiver circuitry and adjusting for such mismatches in response to gain changes in the received signals. In connection with other example embodiments, aspects of the disclosure are directed to a methodology for learning of such IQ mismatches associated with radio-signal receiver circuitry off-line (e.g., in circuit production, in the field or in a test mode) so that during use, such mismatches can be accounted for by making certain adjustments in response to gain changes in the received signals.

In certain example embodiments, aspects of the present disclosure involve providing access to a table or algorithm which associates IQ mismatches and gain, particular to certain aspects of the radio-signal receiver circuitry, so that during use signal circuitry can access the table or algorithm for responding to gain changes in the received signals by accounting for the mismatches and adjusting accordingly.

In a particular more-specific example embodiment, a method of manufacture and/or use involves the provision and access of parameters indicative of IQ mismatches, and then using the parameters to correct for the IQ mismatches by using the parameters in response to actual gain changes in the received radio signal. More specifically, in a quadrature radio-frequency receiver configured to process signals using I and Q components, a first step includes providing parameters indicative of IQ mismatches associated with circuitry of the quadrature radio-frequency receiver due to changes in gain of a received test signal, and a second step is performed while using the quadrature radio-frequency receiver to receive and process a received radio signal, by correcting for the IQ mismatches by using the parameters in response to actual gain changes in the received radio signal.

In another specific example embodiment, a quadrature radio-frequency receiver circuit includes a quadrature-signal processing circuitry configured to process signals using I and Q signal components, and correction circuitry. The quadrature-signal processing circuitry is configured to process the signals using I and Q signal components by providing parameters indicative of IQ mismatches associated with circuitry due to changes in gain of a received test signal. The correction circuitry is configured to, while using the quadrature radio-frequency receiver to receive and process a received radio signal, correct for the IQ mismatches by using the parameters in response to actual gain changes in the received radio signal.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods concerning accounting for known in-phase/quadrature (IQ) mismatches associated with radio-signal receiver circuitry and adjusting for such mismatches in response to gain changes in the received signals. In certain example embodiments, aspects of the present disclosure involve providing access to a table or algorithm which associates IQ mismatches and gain, particular to certain aspects of the radio-signal receiver circuitry, so that during use signal circuitry can access the table or algorithm for responding to gain changes in the received signals by accounting for the mismatches and adjusting accordingly. While not necessarily so limited, various aspects may be appreciated through the following discussion of non-limiting examples which use exemplary contexts.

The use of receivers in wireless systems such as radio and cellular communication systems include receiver front-end processors which provide a signal such as an amplified radio frequency (RF) signal to a mixer. The front-end processing can include, for example, an antenna that receives a radio frequency (RF) signal and provides the signal to an RF amplifier, which amplifies the RF signal. The signal may then be mixed in a mixer with a signal from a local oscillator to produce an IF signal that is amplified in an IF amplifier to produce the amplified IF signal. The RF signal is mixed with the quadrature outputs of a local oscillator to generate respective I and Q signals. The I and Q signals are passed on their respective branches through, for example, low pass filters that eliminate the higher frequency components in the I and Q signals, and through one or more amplifiers to be digitized for further processing at respective analog-to-digital converters (ADCs). Deviations from the ideal I and Q signals in the form of gain or magnitude and phase imbalances, i.e. differing gains for the I and Q signals as well as I and Q signals that are correlated due to the local oscillator inputs at the mixers not being exactly 90 degrees out of phase, can cause degradations in the performance of the receiver.

In a broadcast receiver for portable or mobile applications with high dynamic ranges, the gain of the signal path may be adapted frequently to optimize the signal-to-noise ratio and avoid overload. To reduce system cost, a high level of integration may be implemented, resulting in low- or zero-IF receiver architectures with I and Q signal processing paths and high image rejection. In such architectures, gain changes can lead to a change in the IQ mismatch. Correlation based IQ correction systems may have long integration times (>10 milliseconds) to detect and track the error with sufficient low noise. However, gain changes may occur as often as every 50 microseconds. If the IQ mismatch is gain dependent, the image rejection is reduced in dynamic reception situations like fading or multipath. This can lead to interference between the wanted and the image signal so that the transmitted information cannot be recovered. In accordance with embodiments of the present disclosure, the gain dependency of the IQ mismatch is measured during a production test, stored in a non-volatile memory and applied during normal operation to restore high image rejection within a few microseconds after a gain adjustment.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

In a particular more-specific example embodiment, a method of manufacture and/or use involves the provision and access of parameters indicative of IQ mismatches, and then using the parameters to correct for the IQ mismatches by using the parameters in response to actual gain changes in the received radio signal. More specifically, in a quadrature radio-frequency receiver configured to process signals using I and Q components, the method includes providing parameters indicative of IQ mismatches associated with circuitry of the quadrature radio-frequency receiver due to changes in signal gain. Such parameters may be measured and stored during production as part of configuration or testing and/or during in-field use of the quadrature radio-frequency receiver. While using the quadrature radio-frequency receiver to receive and process a received radio signal, the method includes correcting for the IQ mismatches by using the parameters in response to actual signal gain changes. In various example embodiments, the step of correcting for the IQ mismatches is performed during production as part of configuration or testing and/or during in-field use of the quadrature radio-frequency receiver.

In some example embodiments, the quadrature radio-frequency receiver may be operated in an offline mode by using one or more test conditions to obtain measurements associated with the IQ mismatches in circuitry of the quadrature radio-frequency receiver due to changes in signal gain. According to such embodiments, the parameters indicative of the IQ mismatches are stored in a non-volatile memory, and the quadrature radio-frequency receiver is configured with the parameters indicative of the IQ mismatches.

The parameters indicative of IQ mismatches can correspond to a set of at least three measured gain settings and approximations for other gain-dependent IQ mismatches. The parameters may be provided for dynamic access by using a correlation look-up table stored in a nonvolatile memory, and/or via a logic circuitry executing a correlation algorithm based on the measured gain settings.

In various embodiments, the method includes operating the quadrature radio-frequency receiver in an offline mode. While in the offline mode, measurements associated with the IQ mismatches in circuitry of the quadrature radio-frequency receiver are obtained. In some embodiments, the IQ mismatches in circuitry of the quadrature radio-frequency receiver are due to changes in signal gain which are specific to operating the circuitry in one or more certain temperature conditions. For instance, the quadrature radio-frequency receiver may be operated in an offline mode by obtaining measurements associated with the IQ mismatches under a plurality of sets of temperature conditions. Based on the temperature conditions during operation of the circuitry, the IQ mismatches may be accounted for by correcting for the IQ mismatches using the temperature-indicative parameters in response to actual gain changes in the received radio signal. In such a manner, the parameters are temperature-indicative as the parameters are at least partly based on the plurality of sets of temperature conditions.

In some example embodiments, the quadrature radio-frequency receiver is further configured with a front-end analog circuit portion configured to provide, by phase separation, the I and Q components, and another circuit portion configured to process the I and Q components of the received signal while the I and Q components are separated in parallel component signal paths. In such embodiments, the IQ mismatches, of which the parameters are indicative, are at least partly attributable to transimpedance amplification/attenuation circuits in the respective parallel component signal paths. Additionally and/or alternatively, the quadrature radio-frequency receiver can be configured with mixer-attenuation circuitry in a front-end portion before phase separation, into the I and Q components, of the received signal. In such embodiments, the IQ mismatches, of which the parameters are indicative, are at least partly attributable to the mixer-attenuation circuitry. Similarly, the IQ mismatches may be at least partly attributable to both mismatches associated with the mixer-attenuation circuitry and to mismatches associated with transimpedance amplification/attenuation circuits in the respective parallel component signal paths.

In another specific example embodiment, a quadrature radio-frequency receiver circuit includes quadrature-signal processing circuitry configured to process signals using I and Q signal components. The quadrature-signal processing circuitry can process the signals by providing parameters indicative of IQ mismatches associated with circuitry due to changes in gain of a received test signal. In accordance with this specific example embodiment, the quadrature radio-frequency receiver circuit further includes correction circuitry configured to, while using the quadrature radio-frequency receiver to receive and process a received radio signal, correct for the IQ mismatches. The correction circuitry corrects for the IQ mismatches using the parameters in response to actual gain changes in the received radio signal. In some example embodiments, a non-volatile memory circuit includes a look-up table for providing the parameters. In various embodiments, the quadrature-signal processing circuitry can include a temperature-sensing circuit configured to sense an approximate temperature at which circuitry associated with the IQ mismatches is operating.

The quadrature radio-frequency receiver circuit may include a front-end analog circuit portion configured to provide, by phase separation, the I and Q signal components. Similarly, the quadrature radio-frequency receiver circuit may include another circuit portion configured to process the I and Q components of the received signal while the I and Q signal components are separated in parallel component signal paths. The front-end analog circuit portion can provide, by phase separation, the I and Q signal components, and may include circuitry for which the IQ mismatches are at least partly attributable. For instance, the IQ mismatches, of which the parameters are indicative, may be at least partly attributable to transimpedance amplification/attenuation circuits in the respective parallel component signal paths. In some example embodiments, the quadrature radio-frequency receiver includes attenuation circuitry configured with constant output impedance.

Figure 1:
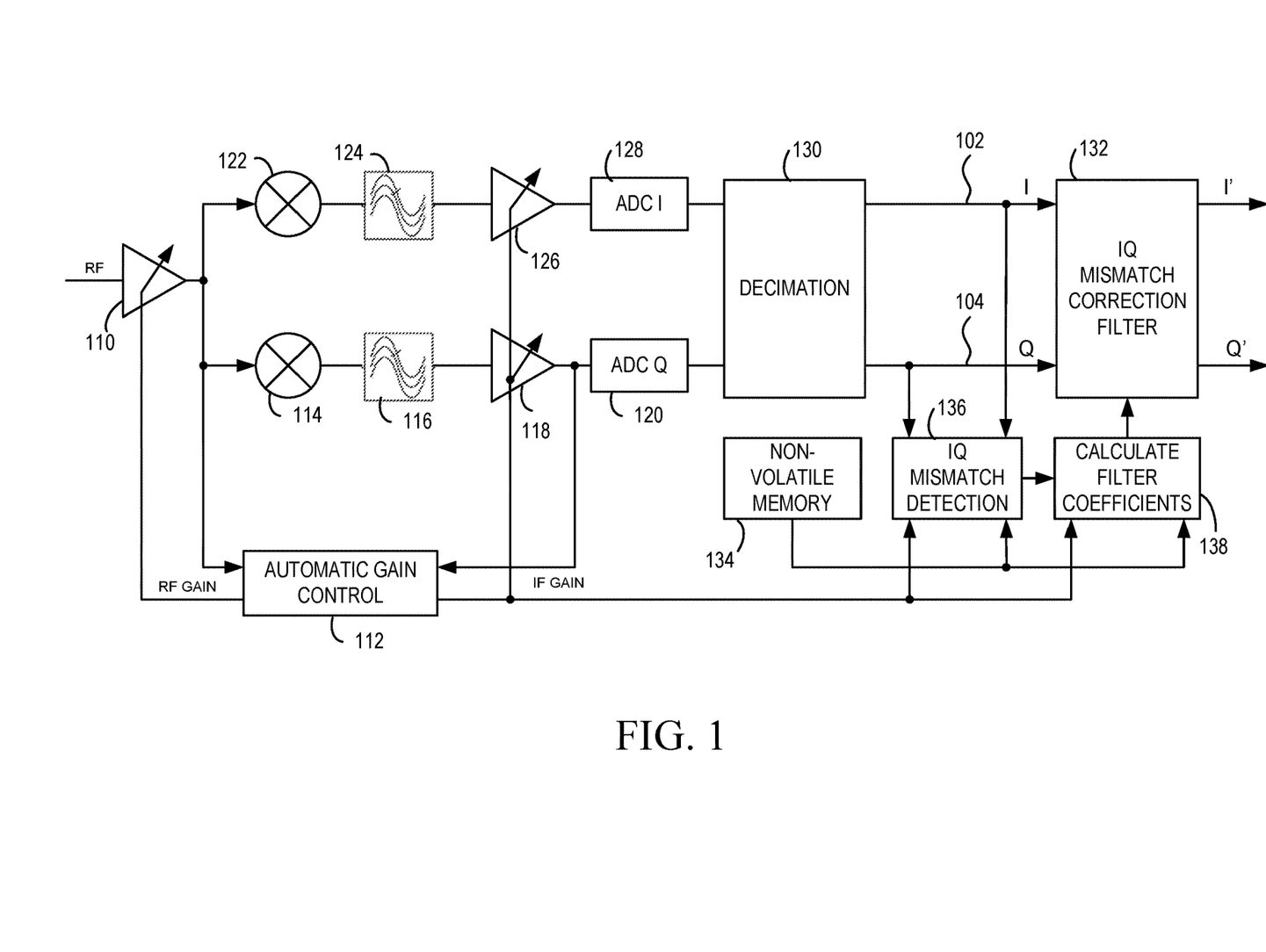
FIG. 1 illustrates a schematic block diagram of a front end of a low- or zero-intermediate frequency (IF) radio receiver, in accordance with the present disclosure.

FIG. 1 illustrates a schematic block diagram of a front end of a low- or zero-IF radio receiver, in accordance with the present disclosure. The front end comprises a quadrature mixer for separating signals into an in-phase path (I-path) 102 and a quadrature phase path (Q-path) 104. The RF input signal is amplified by amplifier 110, then mixed with intermediate frequency carriers using mixers 122, 114 to generate I and Q components. The I and Q components are filtered by filters 124, 116, then amplified by amplifiers 126, 118 and converted to digital signals by analogue-to-digital converters 128, 120. The output of the analogue-to-digital converters 128, 120 may contain more than one channel of interest. The channels may be located at different frequencies in the signal band that is converted by the converters. Each channel may therefore be considered to be a sub-band of the RF input signal.

The in-phase path 102 has an in-phase mixer 122 which receives a radio-frequency input signal and selects in-phase components by mixing them with an in-phase cosinusoidal signal $\cos(\omega rt)$, where $\omega$ (which may also be written as w herein) is the mixer frequency and t is time. The in-phase mixer 122 provides an in-phase mixed-signal to an in-phase intermediate frequency filter 124. The in-phase intermediate frequency filter 124 provides a filtered signal to an in-phase amplifier 126. The in-phase amplifier 126 provides an amplified in-phase signal to an in-phase analogue-to-digital converter 128. The in-phase analogue-to-digital converter 128 provides an in-phase digital domain signal to decimation module 130.

The quadrature phase path 104 is provided in parallel with the in-phase path 102. The quadrature phase path 104 has a quadrature phase mixer 114 which receives the radio-frequency input signal and selects quadrature phase components by mixing them with a quadrature phase sinusoidal signal $\sin(\omega rt)$. The quadrature phase mixer 114 provides a quadrature phase mixed-signal to a quadrature phase intermediate frequency filter 116. The quadrature phase intermediate frequency filter 116 provides a filtered signal to a quadrature phase amplifier 118. The quadrature phase amplifier 118 provides an amplified quadrature phase signal to a quadrature phase analogue-to-digital converter 120. The quadrature phase analogue-to-digital converter 120 provides a quadrature phase digital domain signal to decimation module 130 for reducing the sampling rate in preparation of processing by the IQ mismatch correction filter 132.

The IQ mismatch correction filter 132 may receive signals from both the decimation module 130 and the calculate filter coefficients module 138. An IQ mismatch detection module 136 may include a plurality of amplitude and phase mismatch detectors configured to receive, in parallel, the respective bandpass filtered signals. Each of the amplitude and phase detection units may be configured to determine amplitude and phase mismatch coefficients based on the bandpass filtered signals from a respective sub-band of the plurality of sub-bands. The amplitude can be corrected by a coefficient amplitude coefficient, and the phase can be corrected by the coefficient phase coefficient. The coefficients can be derived by the calculate filter coefficients module 138 and transmitted to the IQ mismatch correction filter 132. The resulting generated signals I' and Q' have an improved IR performance when the coefficients are set to the correct values. Parameters indicative of IQ mismatches associated with circuitry of the quadrature radio-frequency receiver due to changes in gain of a received test signal may be determined during production as part of configuration or testing or during in-field use of the quadrature radio-frequency receiver. Such parameters are provided for dynamic access by using a correlation look-up table stored in a nonvolatile memory 134 and/or via a logic circuitry executing a correlation algorithm based on the measured gain settings. The parameters may be used, such as by the IQ mismatch correction filter 132, to correct for IQ mismatches in response to actual signal gain changes.

The IQ mismatch correction filter 132 can include an input terminal and an output terminal. The input terminal is configured to receive an input signal, which may be an intermediate frequency signal. The input signal can be a time domain signal with a large bandwidth. The input signal may be provided by a digital domain intermediate frequency signal such as that provided by the decimation module 130. The output terminal can be configured to provide a corrected output signal from the correction filter.

In various example embodiments, the IQ mismatch correction filter 132 receives filter coefficients from calculate filter coefficients module 138. The calculate filter coefficients module 138 receives signals from an IQ mismatch detection module 136. The IQ mismatch detection module 136 can include a bandpass filter unit, an amplitude and phase detection unit and a transformation unit. Moreover, one or more automatic gain controllers 112 are configured to apply a gain factor to the bandpass filtered signals and to provide gain corrected bandpass filtered signals to the IQ mismatch detection module 136.

The calculate filter coefficients module 138 uses amplitude and phase mismatch estimates to generate filter coefficients. The amplitude and phase mismatch estimates may be used to retrieve from non-volatile memory 134, the parameters indicative of IQ mismatches, which are used to correct for actual signal gain changes. These coefficients are then implemented by the IQ mismatch correction filter 132 in a parallel signal path for each of a plurality of sub-bands. As such, the IQ mismatch correction filter 132 can apply compensation simultaneously in a number of sub-bands. Particularly, the non-volatile memory 134 can store the calibration data in the form of parameters indicative of IQ mismatches, and correction factors for correcting the IQ mismatches. The non-volatile memory 134 can update the IQ mismatch detection module 136, the IQ mismatch correction filter module 132, and the filter coefficient calculation module 138.

Gain depending IQ mismatch is caused by limited matching between the TIA attenuators in parallel I and Q signal paths. While the component matching can be improved to a certain extend by spending more chip area this will increase cost and add additional parasitic capacitances that influence stability and power consumption.

Another source for gain dependent IQ mismatch is the limited matching of the on-resistances of the transistors in the quadrature mixers if the output impedance of the mixer attenuator changes as function of the gain setting:

$$i_i = \frac{v_{LNA}}{R_s + R_{mix}}, \quad i_q = \frac{v_{LNA}}{R_s + rR_{mix}}$$

$$\varepsilon(k, r) = 1 - \frac{i_q}{i_i} = 1 - \frac{R_s(k) + R_{mix}}{R_s(k) + rR_{mix}} = 1 - \frac{1}{1 + \frac{(rR_{mix} - R_{mix})}{R_s(k) + R_{mix}}}$$

$i_i, i_q$: signal currents $v_{LNA}$: LNA output voltage $R_s(k)$: mixer attenuator resistance $R_{mix}$: mixer transistor on-resistance $r$: mismatch factor between I and Q path $k$: mixer attenuator gain setting $\varepsilon(k, r)$: amplitude error Accordingly, during production test or other offline mode, the gain dependent IQ mismatch may be determined and stored as a calibration table in a non-volatile memory 134. While generating the calibration table, a (linear) approximation can be used between selected gain positions to minimize the test time. For example, it may be sufficient to determine the IQ mismatch at five gain settings for 1 dB, 5 dB, 9 dB, 13 dB and 19 dB IF gain. In this illustration, the junction temperature doesn't change too much during calibration since the IQ mismatch is temperature dependent. During calibration, the extension of the IQ mismatch detector 136 is disabled.

Additionally and/or alternatively, calibration tables from at least a second temperature may be measured and stored in the non-volatile memory 134. The gain dependent error compensation may be extended to receive the actual junction temperature from an on-chip temperature sensor and interpolate or extrapolate between the different calibration tables. For instance, a first calibration table can be measured during wafer level testing at a high junction temperature while a second table can be determined during final test, e.g., at room temperature.

In some example embodiments, calibration tables may be determined and stored for every frequency band of the IQ mismatch correction filter 132. Depending on the implementation of the IQ mismatch detection module 136 (serial band scanning vs. parallel processing) this may require additional test time.

Figure 2:
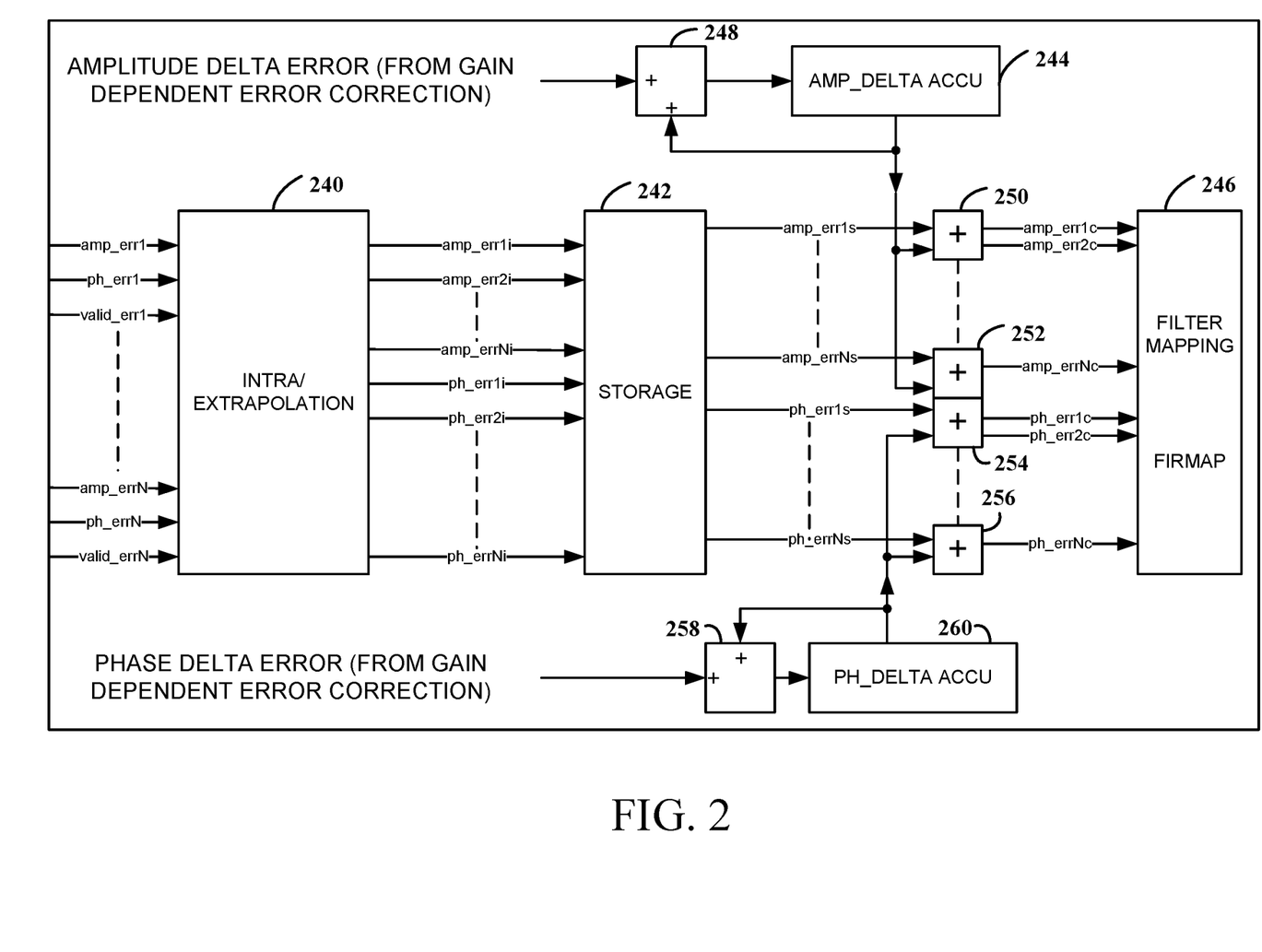
FIG. 2 illustrates an example block diagram of a calculate filter coefficients module, in accordance with the present disclosure.

FIG. 2 illustrates an example block diagram of a calculate filter coefficients module, in accordance with the present disclosure. To compensate the IQ mismatch, the correction filter coefficients may be updated when new values from the mismatch detectors (e.g., 136 illustrated in FIG. 1) are sampled (e.g. every 10 ms). To update the correction filter coefficients in dynamic reception conditions, the filter coefficient calculation may be implemented as shown in FIG. 2. Every time the AGC (e.g., 112 illustrated in FIG. 1) changes the IF gain, the accumulators for gain dependent IQ mismatch changes (e.g., the amp_delta_accu 244 and the ph_delta_accu 260) are updated. For instance, the amplitude delta error is used (e.g., via adder 248) to update the amplitude delta accumulator 244, and the phase delta error is used (e.g., via adder 258) to update the phase delta accumulator 260. The new values are added (e.g., via adders 250, 252, 254, and 256) to the last sampled mismatch detector results, and the results are used to calculate new filter coefficients. In some example embodiments, frequency IQ mismatch information may be mapped on FIR coefficients, with which the filter may be counteracting the IQ errors. For instance a finite impulse response (FIR) map (FIRMAP) 246 could be used to map the errors on FIR correction filter coefficients, such that IQ mismatches may be corrected for by using the parameters. Moreover, the IQ calculate filter coefficients module (e.g., 138 illustrated in FIG. 1) may include an interpolation/extrapolation unit 240. The interpolation/extrapolation unit 240 may be configured to receive the amplitude and phase mismatch coefficients and to determine further amplitude and phase mismatch coefficients by interpolating and/or extrapolating values based on the received amplitude and phase mismatch coefficients. In this way, the noise level in the filter coefficients may be reduced.

The combination of slow IQ mismatch detectors and fast feed forward update from the calibration table allows the system to achieve high image rejection in dynamic reception conditions while accurately tracking and compensating slow IQ mismatch variations (e.g. due to temperature variation).

Figure 3:
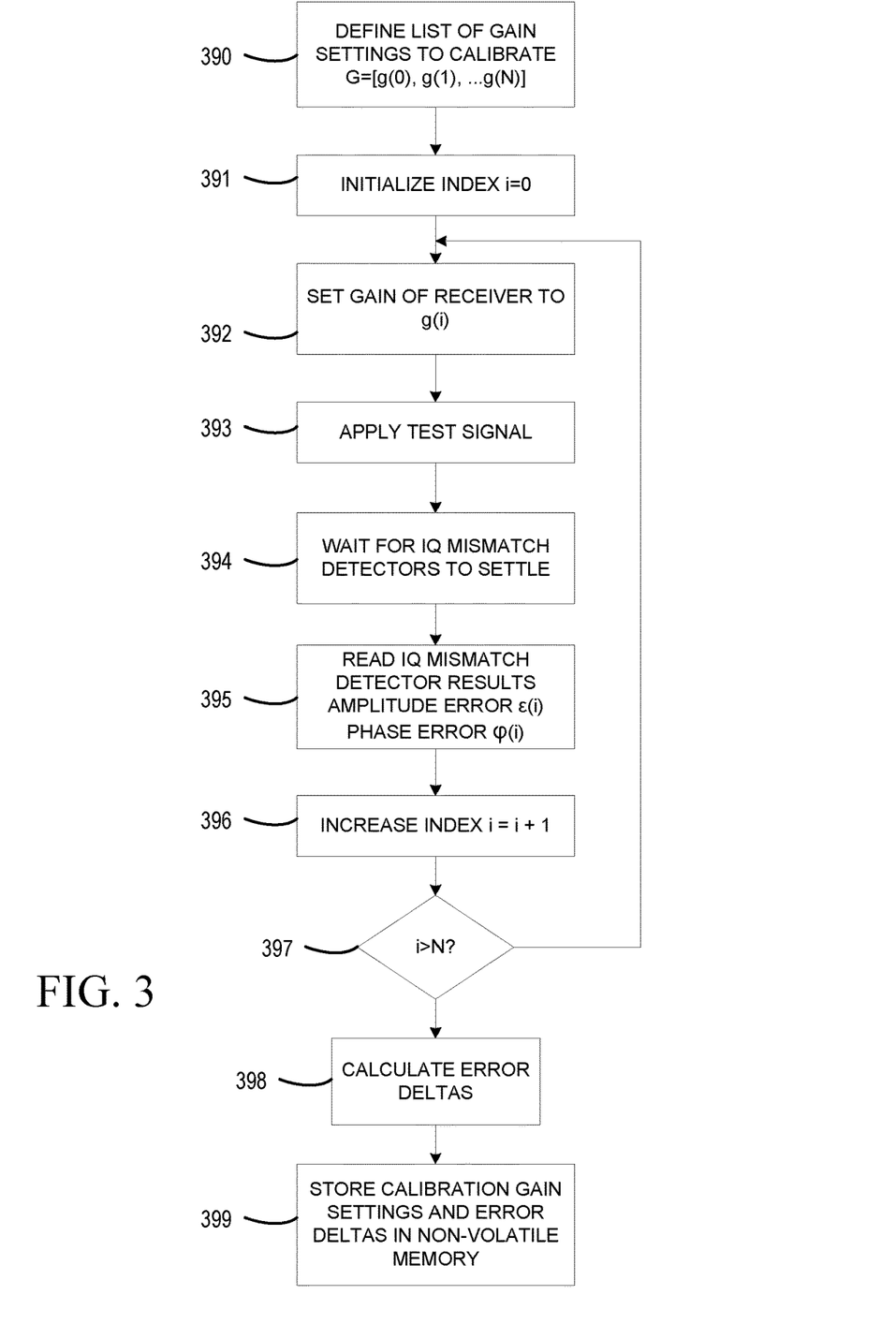
FIG. 3 illustrates an example method for use with a quadrature radio receiver with gain-dependent mismatch correction, in accordance with the present disclosure.

FIG. 3 illustrates an example method for use with a quadrature radio receiver with gain-dependent mismatch correction, in accordance with the present disclosure. At 390, the method includes defining a list of gain settings to calibrate (e.g., G=[g(0), g(1), . . . g(N)]). As discussed herein below with regards to FIG. 4, it may be advantageous to determine the IQ mismatch at less than all gain settings, such as five gain settings for 1 dB, 5 dB, 9 dB, 13 dB and 19 dB IF gain. The gain settings are subsequently used to create a predetermined table containing offsets for correcting IQ mismatches. At 391, the method includes initializing the index i=0. At 392, the method includes setting the gain of the receiver to g(i), and at 393, the method includes applying a test signal. The calibration and application of a test signal to the quadrature radio receiver may be performed while in an offline mode. While in the offline mode, measurements associated with the IQ mismatches in circuitry of the quadrature radio-frequency receiver are obtained.

At 394, the method includes waiting for IQ mismatch detectors (e.g., 136 illustrated in FIG. 1) to settle. At 395, the method includes reading the IQ mismatch detector results, including the amplitude error and the phase error, and at 396, the method includes increasing the index to i=i+1. If i is greater than N, then the method proceeds to step 398 and the error deltas are calculated. The error deltas may be calculated using the following equations:

$$\Delta\varepsilon(j) = \frac{\varepsilon(j+1) - \varepsilon(j)}{g(j+1) - g(j)}; 0 \le j \le N - 1$$

$$\Delta\varphi(j) = \frac{\varphi(j+1) - \varphi(j)}{g(j+1) - g(j)}; 0 \le j \le N - 1$$

If, at 397, it is determined that i is not greater than N, then the method proceeds back to step 392 to again set the gain of the receiver to g(i).

At 399, the method includes storing the calibration gain settings and error deltas in non-volatile memory, such as 134 illustrated in FIG. 1. The calibration gain settings and error deltas may be used by the IQ mismatch correction filter 132 and/or the calculate filter coefficients module 138 to correct for the IQ mismatches by using the parameters in response to actual gain changes in the received radio signal, as described with regards to FIG. 1, FIG. 2, and FIG. 4.

Figure 4:
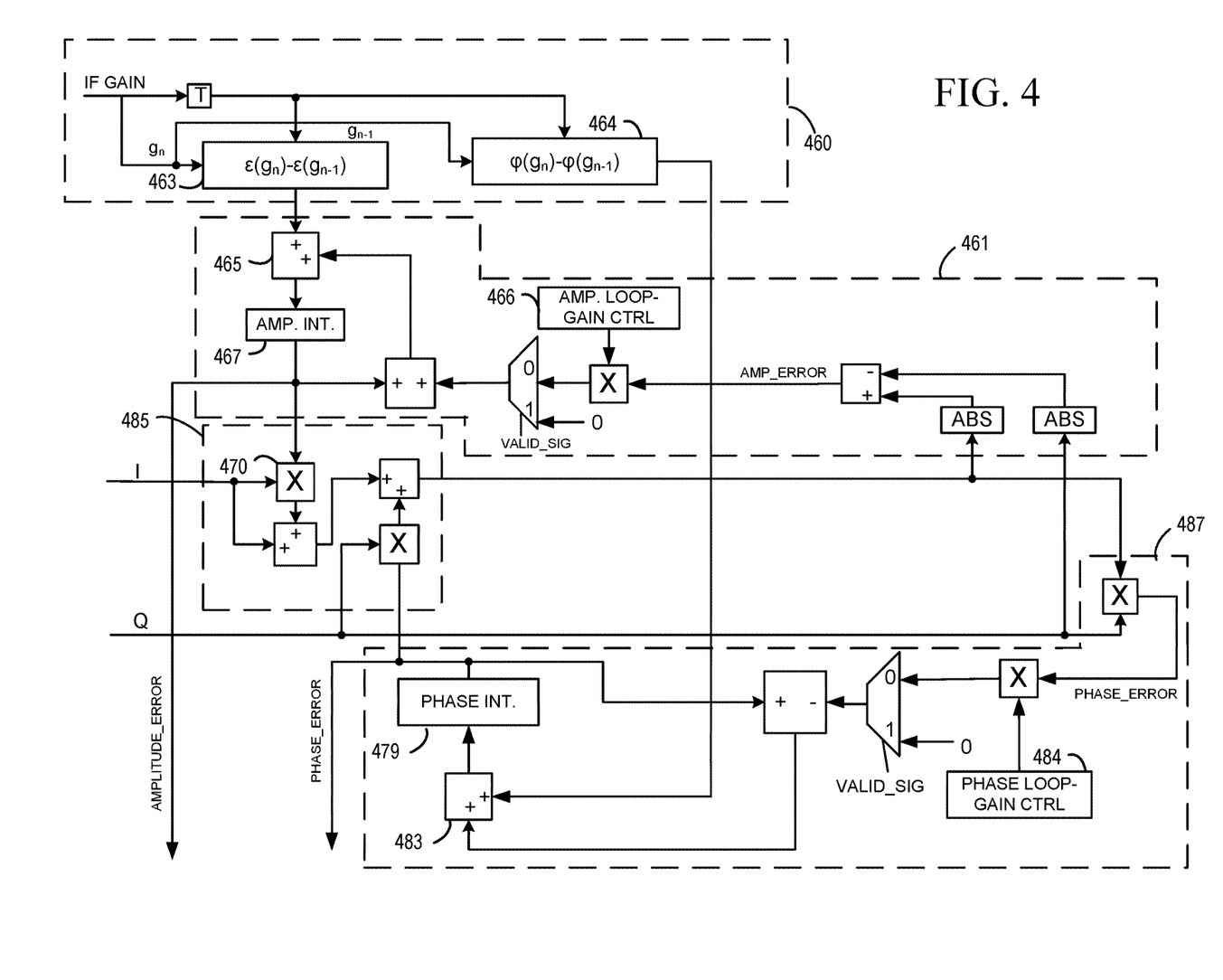
FIG. 4 illustrates an example block diagram of an IQ mismatch detector, in accordance with the present disclosure.

FIG. 4 illustrates an example block diagram of an IQ mismatch detector, in accordance with the present disclosure. The IQ mismatch detector includes circuitry configured to identify positive or negative frequencies associated with a sub-band that contain useful information. Such frequencies may be above a low level threshold. Such frequencies may have positive and negative frequency bands with a difference in signal magnitude that is greater than a distinguishing threshold. The circuitry may be configured to disable coefficient detection for a positive or negative frequency of a sub-band in response to detecting clipping, or saturation. Coefficient detection may be disabled in response to one or more of: the detection of a low signal level for a frequency in a sub-band; the detection of positive and negative frequencies within a sub-band having similar a magnitude within the distinguishing threshold; the detection of clipping of the input signal; or automatic gain control being executed for a sub-band.

The mismatch change block 460 receives the IF GAIN information from the automatic gain control. At every iteration the actual gain information is compared with the gain from the previous iteration. If the gain has changed, the amplitude mismatch change table stored in the non-volatile memory is used to calculate the amplitude mismatch change caused by the gain change. This value ($\varepsilon(g_n) - \varepsilon(g_{n-1})$) is input to the amplitude feedback loop 461. In a similar manner the phase mismatch change ($\varphi(g_n) - \varphi(g_{n-1})$) is handled. The amplitude feedback loop 461 detects the gain mismatch (amplitude error), while the phase feedback loop 487 detects the phase mismatch. The settling speed of the amplitude and phase integrators is proportional to the loop gain controlled by the respective blocks 466 and 484. During startup of the system the amplitude and phase loop gain is set to a high value. In this situation the amplitude and phase integrators quickly adapt to values near the actual mismatch. However a high loop gain also causes large noise on the integrators. Therefore the loop gain control blocks reduce the loop gain over time, which also reduces the settling speed.

To accurately detect the gain and temperature dependent IQ mismatch during normal operation, the IQ mismatch detector may be configured as illustrated in FIG. 4. If the automatic gain control (AGC) changes the IF gain, the calibration table stored in memory (e.g., 134 of FIG. 1) is used to calculate the IQ mismatch change between the last IF gain setting and the actual IF gain setting. The amplitude mismatch change 463 is added (e.g., via adder 465) to the actual value of the amplitude mismatch integrator 467 while the phase mismatch change 464 is added (e.g., via adder 483) to the phase mismatch integrator 479.

More particularly, the major operational blocks illustrated in FIG. 4 include a mismatch change block 460, an amplitude feedback loop block 461, a mismatch correction block 485, and a phase feedback loop block 487. The inputs to FIG. 4 include the IF gain, as received from the automatic gain control module (e.g., 112 illustrated in FIG. 1). More particularly, the input to the mismatch change block 460 includes the IF gain, and the output of the mismatch change block 460 includes both a signal to the phase feedback loop block 487, and a signal to the amplitude mismatch integrator 467. The input to the amplitude feedback loop block 461 includes signals from the mismatch correction block 485, and the output from the amplitude feedback loop block 461 includes signals to multiplier 470, and an amplitude error signal. Similarly, the input to the mismatch correction block 485 includes the I signal, the Q signal as received from the decimation module (e.g., 130 illustrated in FIG. 1), and a signal from the amplitude mismatch integrator 467. The output of the mismatch correction block 485 includes a signal to the phase feedback loop block 487. The input to the phase feedback loop block 487 includes signals from the mismatch correction block 485, and the output of the phase feedback loop block 487 includes a phase error signal.

MORE DETAILED AND/OR EXPERIMENTAL EMBODIMENTS

Consistent with the above-characterized embodiments, various other embodiments are based on implementations which involve alternative and/or additional features which are different than disclosed above for use as part of the above embodiments. Accordingly, the present disclosure is not necessarily limited to specific methods, systems, applications and devices in and stemming from the specific embodiments disclosed herein. Other related embodiments and aspects can be fully incorporated in each such disclosed (contemplated/suggested) embodiment. Some of these aspects and embodiments would be recognized from the following discussion.

In connection with various embodiments, an improvement in the image rejection ration may be obtained by utilization of the circuitry depicted in FIG. 1. For instance, as the IF gain is continuously ramped up and down between g(IF)=1 dB and g(IF)=16 dB, if the gain dependent error compensation is disabled, the image rejection ratio (IRR) is highly dependent on the actual IF gain. The IQ mismatch detectors may settle to an average IF gain of 8 dB resulting in high image rejection ratio for this gain setting (IRR>75 dB). The image rejection ratio may drop to values of IRR~53 dB if the IF gain reduces to minimum.

If however, the gain dependent error compensation is enabled, the image rejection ratio improves to values of more than 65 dB for all gain settings. Remaining variation in the image rejection ratio may be caused by the remaining frequency and temperature dependency of the IQ mismatch change over IF gain, the interpolation errors due to the limited number of calibration points and measurement accuracy during calibration.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, and/or other circuit-type depictions (e.g., for instance, reference numerals 130, 132, 138, 136, 134, and 112 of FIGS. 1, 240, 242, 244, 246, and 260 of FIG. 2, and 467, 466, 479, and 484 of FIG. 4 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1, 2, and 4. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described with regards to FIG. 1 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, different, fewer, and/or additional steps may be carried out, beyond that which is illustrated in FIG. 3. Such modifications do not depart from the true spirit and scope of various aspects of the disclosure, including aspects set forth in the claims.

What is claimed is:

1. A method of manufacture or use comprising:
in a quadrature radio-frequency receiver configured to process signals using I and Q components, providing parameters indicative of in-phase/quadrature (IQ) mismatches associated with circuitry of the quadrature radio-frequency receiver due to changes in signal gain; and
while using the quadrature radio-frequency receiver to receive and process a received radio signal, correcting for the IQ mismatches by using the parameters in response to actual signal gain changes.

2. The method of claim 1, wherein the parameters are indicative of IQ mismatches due to changes in gain of a received test signal, and the IQ mismatches are corrected in response to actual gain changes in the received test signal, and the step of correcting is performed during production as part of configuration or testing or during in-field use of the quadrature radio-frequency receiver, the method further including:
operating the quadrature radio-frequency receiver in an offline mode by using one or more test conditions to obtain measurements associated with the IQ mismatches in circuitry of the quadrature radio-frequency receiver due to changes in signal gain, and configuring the quadrature radio-frequency receiver with the parameters indicative of the IQ mismatches.

3. The method of claim 1, further including operating the quadrature radio-frequency receiver in an offline mode by using test conditions to obtain measurements associated with the IQ mismatches in circuitry of the quadrature radio-frequency receiver due to changes in signal gain, and configuring the quadrature radio-frequency receiver by storing the parameters indicative of the IQ mismatches in a non-volatile memory.

4. The method of claim 1, wherein the parameters indicative of IQ mismatches correspond to a set of at least three measured gain settings and approximations for other gain-dependent IQ mismatches, and wherein the parameters are provided for dynamic access by using at least one of: a correlation look-up table stored in a nonvolatile memory; and via a logic circuitry executing a correlation algorithm based on the measured gain settings.

5. The method of claim 1, further including operating the quadrature radio-frequency receiver in an offline mode by obtaining measurements associated with the IQ mismatches in circuitry of the quadrature radio-frequency receiver due to changes in signal gain which are specific to operating the circuitry in one or more certain temperature conditions.

6. The method of claim 1, further including
operating the quadrature radio-frequency receiver in an offline mode by obtaining measurements associated with the IQ mismatches in circuitry of the quadrature radio-frequency receiver due to changes in signal gain under a plurality of sets of temperature conditions, wherein the parameters are temperature-indicative as at least partly based on the plurality of sets of temperature conditions, and based on one of the plurality of sets of temperature conditions during operation of the circuitry of the quadrature radio-frequency, accounting for the IQ mismatches by correcting for the IQ mismatches using the temperature-indicative parameters in response to actual gain changes in the received radio signal.

7. The method of claim 1, wherein the quadrature radio-frequency receiver is further configured with a front-end analog circuit portion configured to provide, by phase separation, the I and Q components, and another circuit portion configured to process the I and Q components of the received signal while the I and Q components are separated in parallel component signal paths.

8. The method of claim 1, wherein the quadrature radio-frequency receiver is further configured with a circuit portion configured to process the I and Q components of the received signal while the I and Q components are separated in parallel component signal paths, wherein the IQ mismatches, of which the parameters are indicative, are at least partly attributable to transimpedance amplification/attenuation circuits in the respective parallel component signal paths.

9. The method of claim 1, wherein the quadrature radio-frequency receiver is further configured with mixer-attenuation circuitry in a front-end portion before phase separation, into the I and Q components, of the received signal, and wherein the IQ mismatches, of which the parameters are indicative, are at least partly attributable to the mixer-attenuation circuitry.

10. The method of claim 1, wherein the quadrature radio-frequency receiver is further configured with mixer-attenuation circuitry in a front-end portion before phase separation, into the I and Q components, of the received signal, and with a circuit portion configured to process the I and Q components of the received signal while the I and Q components are separated in parallel component signal paths, and wherein the IQ mismatches, of which the parameters are indicative, are at least partly attributable to both mismatches associated with the mixer-attenuation circuitry and to mismatches associated with transimpedance amplification/attenuation circuits in the respective parallel component signal paths.

11. A quadrature radio-frequency receiver circuit comprising:

quadrature-signal processing circuitry configured to process signals using I and Q signal components, by providing parameters indicative of in-phase/quadrature (IQ) mismatches associated with circuitry due to changes in gain of a received test signal; and correction circuitry configured to, while using the quadrature radio-frequency receiver to receive and process a received radio signal, correct for the IQ mismatches by using the parameters in response to actual gain changes in the received test signal.

12. The quadrature radio-frequency receiver circuit of claim 11, further including a non-volatile memory circuit including a look-up table for providing the parameters.

13. The quadrature radio-frequency receiver circuit of claim 11, further including a temperature-sensing circuit configured to sense an approximate temperature at which circuitry associated with the IQ mismatches is operating.

14. The quadrature radio-frequency receiver circuit of claim 11, further including a front-end analog circuit portion configured to provide, by phase separation, the I and Q signal components, and another circuit portion configured to process the I and Q components of the received signal while the I and Q signal components are separated in parallel component signal paths.

15. The quadrature radio-frequency receiver circuit of claim 11, further including a front-end analog circuit portion configured to provide, by phase separation, the I and Q signal components, and wherein the front-end analog circuit portion includes circuitry for which the IQ mismatches are least partly attributable.

16. The quadrature radio-frequency receiver circuit of claim 11, further including a front-end analog circuit portion configured to provide, by phase separation, the I and Q signal components, and another circuit portion configured to process the I and Q components of the received signal while the I and Q signal components are separated in parallel component signal paths and wherein the IQ mismatches are least partly attributable to circuitry associated with at least one of the front-end analog circuit portion and of the other circuit portion.

17. The quadrature radio-frequency receiver circuit of claim 11, further including a front-end analog circuit portion configured to provide, by phase separation, the I and Q signal components, and another circuit portion configured to process the I and Q components of the received signal while the I and Q signal components are separated in parallel component signal paths, and wherein the IQ mismatches are least partly attributable to circuitry associated with attenuation circuits respectively configured in the front-end analog circuit portion and the other circuit portion.

18. The quadrature radio-frequency receiver circuit of claim 11, further including attenuation circuitry configured with constant output impedance.

* * * * *